United States Patent [19]

Beauducel et al.

[11] Patent Number: 4,984,222

[45] Date of Patent: Jan. 8, 1991

[54] PIEZOELECTRIC SENSOR COMPRISING AT LEAST ONE PAIR OF FLEXIBLE SENSITIVE ELEMENTS OF GREAT LENGTH

[75] Inventors: Claude Beauducel, Henonville; Etienne Bolze, Rueil-Malmaison, both of France

[73] Assignee: Institut Francais du Petrole, Rueil Malmaison, France

[21] Appl. No.: 378,323

[22] Filed: Jul. 11, 1989

[30] Foreign Application Priority Data

Jul. 11, 1989 [FR] France .................................. 88 09519

[51] Int. Cl.$^5$ ........................................... H04R 17/00
[52] U.S. Cl. .................................... 367/159; 367/169; 367/15; 310/337
[58] Field of Search .................... 367/15, 20, 169, 177, 367/159, 155; 310/337

[56] References Cited

U.S. PATENT DOCUMENTS

| | | | |
|---|---|---|---|
| 3,798,474 | 3/1974 | Cassand et al. | 367/169 |
| 4,768,173 | 8/1988 | Gautier et al. | 367/15 |
| 4,849,946 | 7/1989 | Beauducel | 367/155 |

*Primary Examiner*—Charles T. Jordan
*Assistant Examiner*—J. Woodrow Eldred
*Attorney, Agent, or Firm*—Antonelli, Terry, Stout & Kraus

[57] ABSTRACT

A piezoelectric sensor comprising at least one pair of flexible sensitive elements of great length whose respective electrodes are connected in parallel. The interconnection is provided by interlacing the sensitive elements so that the two electrodes of each of the flexible sensitive elements are alternately in electric contact with the two electrodes of at least one other sensitive element. The sensor may be formed by winding at least one pair of sensitive elements on a support in two spirals of opposite directions with interlacing. The chosen assembly method provides both good mechanical strength and simplifies the electric connections because of the multiple electric contacts between the electrodes.

8 Claims, 1 Drawing Sheet

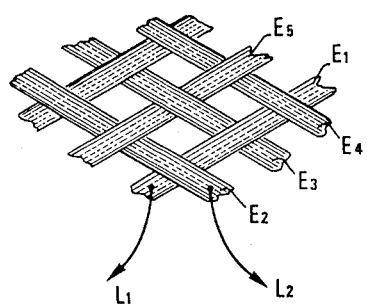
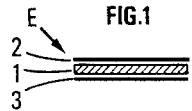
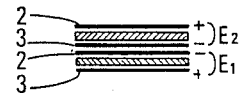
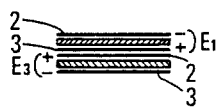
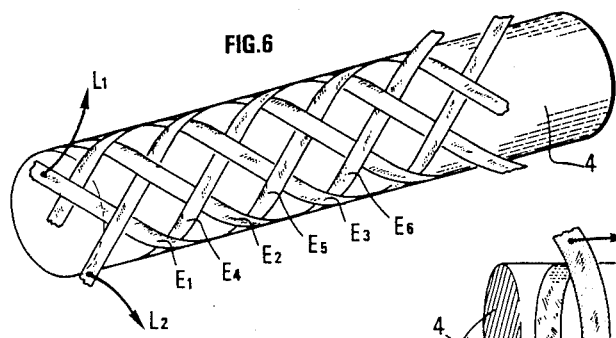
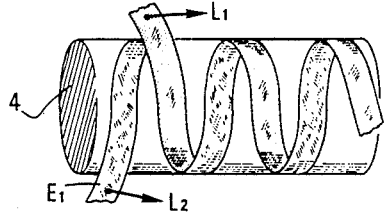
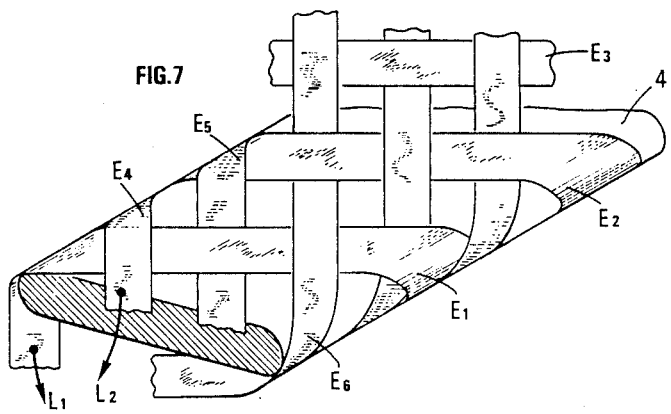

PIEZOELECTRIC SENSOR COMPRISING AT LEAST ONE PAIR OF FLEXIBLE SENSITIVE ELEMENTS OF GREAT LENGTH

BACKGROUND OF THE INVENTION

1. Field of the Invention

The invention relates to an improved piezoelectric sensor comprising one or more pairs of sensitive elements of great length.

Such a sensor may in particular be used as a hydrophone for different off-shore operations and, for example, for seismic sea prospection for receiving the seismic waves coming from the immersed sub-soil, which have been transmitted by a marine seismic source and reflected by the underground geological discontinuities.

2. Description of the Prior Art

The sensitive elements are formed of a substrate having piezoelectric properties and two electrodes disposed on each side of this substrate.

The substrate may also be in the form of ribbons or flexible strips made from a synthetic plastic material to which a treatment confers piezoelectric properties. Materials are generally used such as PVDF (polyvinylidene fluoride), polyethylene, PTFE (polytetrafluoroethylene) etc.

The flexible sensitive elements are very often used in the form of ribbons or strips disposed on a flat support or wound in a spiral about a cylindrical core. The ribbons or strips are generally combined in pairs so as to increase the sensitivity of the assembly. By disposing the ribbons or strips on each side of a support with opposite polarities and connecting them electrically, the parasitic voltages due to the flexing of the support and accelerations are compensated for.

By using flexible ribbons or strips, continuous hydrophones may be constructed of relatively great length which provide wave number filtering. Incorporated in seismic streamers towed by a ship, the flexible ribbons or strips filter out certain parasitic noises and facilitate reception of the signals reflected by the discontinuities of the immersed sub-soil, in response to seismic waves transmitted by a towed source.

In a known arrangement, a piezoelectric receiver is formed by winding a first sensitive strip associated with its two electrodes in a spiral about an insulating cylindrical core. An insulating flexible strip is superimposed by winding on the first sensitive strip. On top, a second sensitive strip is further wound in a spiral in the opposite direction to the first. Rings respectively contacting the electrodes of the two sensitive strips are connected by conducting wires so as to form a series interconnection.

In another known arrangement, between the two crossed spiral windings, a thin conducting ribbon may be interposed with interposed this conducting ribbon being transparent to the sound waves. The ribbon covers the side edges of all the turns of the lower winding and provides a good electric contact between its upper electrode and the lower electrode of the superimposed winding, which contributes to reducing the electric resistance of the connection and improves the electric reliability.

Piezoelectric sensors of the aforementioned type are described, for example, in French Patent No. 2,145,099 and corresponding U.S. Pat. No. 3,798,474 or Published French Patent Applications Nos. 2,601,132 and 2,603,422 respectively corresponding to U.S. Pat. Nos. 4,768,173 and 4,810,913.

SUMMARY OF THE INVENTION

The present invention provides an improved piezoelectric sensor formed from sensitive elements each comprising a substrate made from a flexible material having piezoelectric properties and two fine electrodes disposed on each side of the substrate, this sensor being adapted to simplify the manufacturing operations and offer increased reliability.

It is characterized in that the sensitive elements are interlaced so that the two electrodes of each of them are alternately in electric contact with one of the electrodes of at least one other sensitive element.

The sensor may, for example, comprise at least two sensitive elements interlaced so that each electrode of one of the sensitive elements is in electric contact alternately with the two electrodes of the other sensitive element.

In one embodiment, the sensor may comprise at least one braid of sensitive elements each formed from at least a pair of sensitive elements wound in spirals of opposite directions with interlacing. This braid is disposed for example on a substantially cylindrical or else flattened central core.

Interlacing of the sensitive elements has numerous advantages:

(1) The two sensitive elements of each pair play the same role because each of them is alternately below and above the other. Their respective responses to the stresses exerted are very similar. In all the embodiments where the sensitive elements of each pair are adapted and interconnected to provide compensation of the anisotropic stresses, due particularly to accelerations, the claimed sensor offers a better immunity to noise.

(2) Because of the interlacing of the sensitive elements which multiplies the contact zones between their respective electrodes:
  the connection resistances are lower, which contributes to widening the passband,
  the total number of electric connections necessary for the electric combination of the sensitive elements of each pair is lower, and
  a cut located on any one of the conducting films forming the electrodes of the two sensitive element of each pair is without appreciable consequence, which makes it possible to obtain correct specifications more readily.

(3) Because of the interlacing, the mechanical strength of each assembly of sensitive elements is ensured. The addition of mechanical connection means is no longer indispensable for obtaining its cohesion.

BRIEF DESCRIPTION OF THE DRAWINGS

Other features and advantages of the sensor of the invention will be clear from the following description of embodiments given by way of non limiting examples, with reference to the accompanying drawings in which:

FIG. 1 shows a sensitive element schematically in section,

FIG. 2 shows, in the general case, interlacing of several sensitive elements,

FIG. 3 shows in section the relative arrangement of a first sensitive element with respect to a second sensitive element at their intersection point, FIG. 4 shows in section the relative arrangement of the same sensitive element with respect to a third element at an adjacent intersection point, FIG. 5 shows schematically a first embodiment of the sensor comprising a pair of sensitive elements wound on a particular support, FIG. 6 shows schematically a second embodiment of the sensor comprising a plurality of interlaced sensitive elements, and FIG. 7 shows schematically a third embodiment of the sensor in which a plurality of sensitive elements is disposed on a flattened support.

DESCRIPTION OF THE PREFERRED EMBODIMENT

As shown most clearly in FIG. 1, each sensitive element generally designated by the reference character E is, for example, in the form of an elongate strip comprising a thin ribbon 1 made from a material with piezoelectric properties on the opposite faces of which are deposited two conducting films 2, 3 forming the electrodes.

In its most general form, as shown most clearly in FIG. 2, the sensor of the invention comprises a first row of several sensitive elements $E_2$, $E_3$, $E_4$, etc. interlaced with a second row of sensitive elements $E_1$, $E_5$, etc. For example, sensitive element $E_1$ of the second row crosses successively the sensitive elements $E_2$, $E_3$, $E_4$ etc of the first row. The sensitive element $E_1$ is disposed so that it passes successively below the sensitive element $E_2$, above $E_3$, below the sensitive element $E_4$ etc. At, for example, a first intersection, a first electrode 2 is in contact with the second electrode 3 of $E_2$ (resulting in a superimposition such as shown in FIG. 3). At the next intersection, the second electrode 3 is in contact with the first electrode 2 of the sensitive element $E_3$. Electrode 2 of $E_1$ is again in contact at the intersection with $E_4$. Similarly, any sensitive element $E_2$, $E_3$, $E_4$... of the first row passes successively above and below the sensitive elements of the second row and any one of its electrodes place, in electric contact with the same electrode (2 or 3), sensitive elements $E_1$, $E_5$ etc. . . of the second row, two rows away from each other. Any distance may separate the sensitive elements of the same row but it is possible to arrange them in a regular checker-board pattern. Whatever the spacing between the sensitive elements, the chosen interlacing method provides both a certain mechanical strength of the assembly and, because of the multiple contacts between the electrodes, paralleling of the different sensitive elements which form it. To pick up the voltage which the assembly of sensitive elements develops in response to stresses and apply it to an appropriate pre-amplifier, two conductors $L_1$ and $L_2$ are sufficient, soldered to two opposite electrodes. The sensor thus formed may be deposited on a support of any shape.

In the embodiment shown in FIG. 5, the sensor may be formed by winding at least one pair of sensitive elements on a support 4. The two windings of the same pair are disposed in two spirals of opposite directions. At each intersection, the same sensitive element is alternately above and below the other sensitive element of the same pair. If the sensor comprises a plurality of sensitive elements $E_1$–$E_6$ (FIG. 6), each of the sensitive elements is wound in a spiral and disposed alternately above and below the sensitive elements which it successively intersects. Thus, a mechanical and electric interconnection of the different sensitive elements is also provided. At one end of the support, two electric conductors $L_1$ and $L_2$ are sufficient for connecting the parallel combination of the sensitive elements to the input of an appropriate pre-amplifier.

The support may have any shape. A solid or tubular cylindrical support may be chosen having a more or less flattened shape (FIG. 5). A flat support (FIG. 7) may also be used whose opposite flat faces are joined together by rounded portions. Their radius of curvature must be sufficient to avoid any breakage of the sensitive elements and cause micro-cuts of the conducting films serving as electrodes.

The permanent intersection of the turns provided by winding one or more pairs of sensitive elements makes it possible to obtain a stable structure which holds up on its own. It is then not necessary, during manufacture of the substrate, to add fixing means for holding the superimposed windings in position. If a sheath is disposed about the sensor, after its manufacture, it is generally sufficient to stabilize the turns about the support. The manufacturing operations are thus simplified.

What is claimed is:

1. An improved piezoelectric sensor formed from sensitive elements, each sensitive element comprising a substrate of a flexible material having piezoelectric properties, at least one fine electrode disposed on a respective side of the substrate, wherein said sensitive elements are interlaced so that the respective electrodes of one of the respective elements are alternately in electric contact with the respective same electrodes of at least one other sensitive element.

2. The sensor as claimed in claim 1, comprising at least two sensitive elements interlaced so that a respective electrode of one of said at least two sensitive elements is in alternate electric contact with the respective same electrodes of the other of said at least two sensitive elements.

3. The sensor as claimed in claim 1, comprising at least one braid of sensitive elements each formed from at least two sensitive elements wound in interlacing spirals of opposite directions.

4. The sensor as claimed in claim 3, wherein said braid is disposed on a substantially cylindrical central core.

5. The sensor as claimed in claim 3, wherein said braid is disposed about a flattened central core.

6. The sensor as claimed in claim 1, wherein said braid is disposed about a support comprising a plate with rounded edges.

7. The sensor as claimed in claim 1, comprising a plurality of interlaced sensitive elements, each of the electrodes of each sensitive element being in contact at regular intervals with the same electrode of another sensitive element.

8. The sensor as claimed in claim 7, comprising two sensitive elements disposed in interlaced sprial windings so as to provide contact of same electrodes at regular intervals.

* * * * *

UNITED STATES PATENT AND TRADEMARK OFFICE
CERTIFICATE OF CORRECTION

PATENT NO.   :   4,984,222

DATED        :   Jan. 8, 1991

INVENTOR(S)  :   C. Beauducel, et al

It is certified that error appears in the above-identified patent and that said Letters Patent is hereby corrected as shown below:

On the Title page

Item
[30]   Foreign Application Priority Data
       Jul. 11, 1988 [FR] ..................88 09519

Signed and Sealed this

Twenty-sixth Day of January, 1993

Attest:

STEPHEN G. KUNIN

Attesting Officer

Acting Commissioner of Patents and Trademarks